(12) United States Patent
Xu et al.

(10) Patent No.: US 6,255,929 B1
(45) Date of Patent: Jul. 3, 2001

(54) METHOD OF MAKING OPTIMIZED, AIR-CORE ELECTROMAGNETS

(75) Inventors: Hao Xu, Stanford; Steven Conolly, Menlo Park, both of CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/698,825

(22) Filed: Oct. 26, 2000

Related U.S. Application Data

(62) Division of application No. 09/046,946, filed on Mar. 23, 1998.

(51) Int. Cl.$^7$ ....................................................... H01F 5/00
(52) U.S. Cl. ............................................................. 335/299
(58) Field of Search .................................... 335/216, 299; 324/318–320

(56) References Cited

U.S. PATENT DOCUMENTS

| | | | |
|---|---|---|---|
| 4,721,914 | 1/1988 | Fukushima et al. | 324/320 |
| 5,084,677 | 1/1992 | McDougall | 324/320 |
| 5,250,901 | 10/1993 | Kaufman et al. | 324/318 |
| 5,382,904 | 1/1995 | Pissanetzky | 324/319 |
| 5,396,207 | 3/1995 | Dorri et al. | 335/216 |
| 5,659,281 | 8/1997 | Pissanetzky | 335/296 |
| 5,717,333 | 2/1998 | Frese et al. | 324/319 |
| 6,067,001 | * 5/2000 | Xu et al. | 335/299 |
| 6,075,365 | * 5/2000 | Conolly | 324/320 |

OTHER PUBLICATIONS

Hoult et al. "Accurate Shim–Coil Design and Magnet–Field Profiling by a Power–Minimization–Matrix Method", Journal of Magnetic Resonance, Series A 108, 9–20 (1994).
Kitamura et al. "An Optimal Design Technique for Coil Configurations in Iron–Shielded MRI Magnets", IEEE Transactions on Magnetics, vol. 30, No. 4, Jul., 1994.

\* cited by examiner

*Primary Examiner*—Ramon M. Barrera
(74) *Attorney, Agent, or Firm*—Lumen Intellectual Property Services, Inc.

(57) ABSTRACT

Method of making Optimized electromagnets. The electromagnets have at least three coaxial coils and can be symmetric or asymmetric. The coils can be circular or elliptical. The electromagnets have a coil region in which the coils are located. The coil region can have a bore of any rotationally symmetric shape or any elliptical shape. The coil region is shaped to allow an object to access a predetermined axial magnetic field produced by the magnet. The magnets are optimized in that they require the least amount of power (for resistive electromagnets) or wire length (for superconducting magnets) for the given predetermined axial magnetic field and the shape of the predetermined coil region. The method of present invention restricts the current density in each coil to the same value. This simplification allows the magnet design optimization problem to be cast as a $L^1$-norm minimization linear programming calculation for which a global solution can always be found. Solution of the calculation provides the optimized currents in each of a large number of virtual coils. The method automatically chooses the minimum number of coils so the magnets are practical to construct.

12 Claims, 12 Drawing Sheets

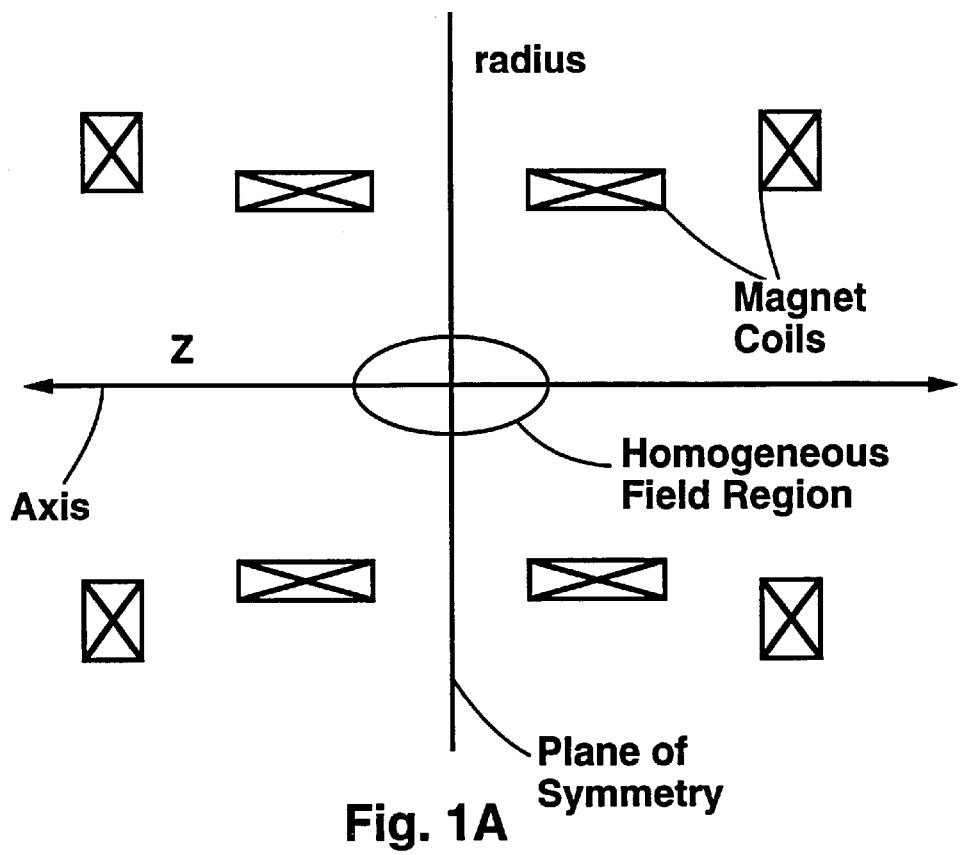
Fig. 1A
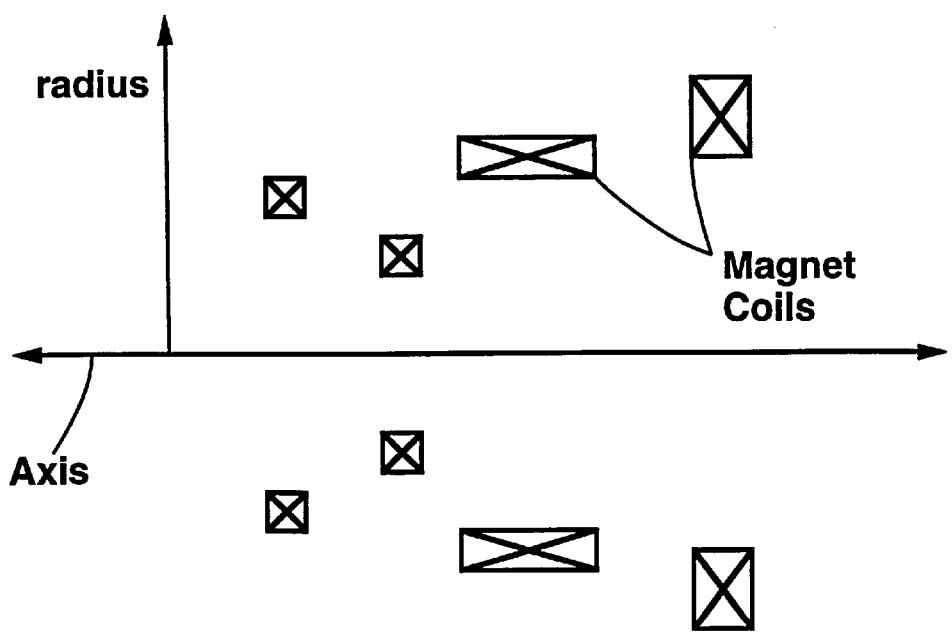
Fig. 1B  No plane of Symmetry Perpendicular to Axis

METHOD OF MAKING OPTIMIZED, AIR-CORE ELECTROMAGNETS

RELATED APPLICATION

This application is a divisional application to the application Ser. No. 09/046,946 filed Mar. 23, 1998.

FIELD OF THE INVENTION

This invention relates generally to methods of making electromagnets. More particularly, it relates to a method of making axial homogeneous magnetic field magnets for use in magnetic resonance imaging and spectroscopy devices and the like.

BACKGROUND OF THE INVENTION

Magnetic resonance imaging (MRI) is a common and well known technique for imaging the internal structure of objects and for medical diagnosis. MRI requires that the object to be imaged be placed in a uniform (typically to within 40 ppm) and strong (typically in the range of 0.5 to 1.5 Tesla) magnetic field. Generating such magnetic fields is difficult and expensive.

Prepolarized MRI (PMRI) is a new technique which uses a strong, nonuniform pulsed magnetic field in combination with a weaker, uniform magnetic field to perform imaging. PMRI is also referred to as switched-field MRI in the literature. Reference can be made to U.S. Pat. No. 5,629,624 to Carlson et al. and U.S. Pat. No. 5,057,776 to Macovski concerning PMRI.

Since the magnetic field in a PMRI device must be pulsed, researchers have experienced severe difficulties in obtaining pulse-to-pulse consistency of the magnetic field. These difficulties can be caused by ferromagnetic pole pieces which experience magnetic hysteresis. The hysteresis changes the magnetic field distribution in unpredictable ways. Therefore, it is believed that ferromagnetic pole pieces are incompatible with PMRI without significant control over hysteresis.

Another result of the pulsed magnetic field is that it renders a large PMRI device very difficult to build. The magnetic energy stored in the magnet must be removed and restored with every pulse. This practically limits the amount of energy which can be stored in the pulsed magnet and thus the size of the PMRI device. Therefore, future PMRI devices will likely be small dedicated imagers, dedicated to imaging small body parts such as hands, feet, knees, heads, breasts, neck and the like.

Imaging small body parts places limitations on magnet geometry. Most body parts are not cylindrical and therefore do not efficiently occupy the volume inside a traditional cylindrical magnet assembly. A cylindrical magnet assembly is a collection of coils arranged on the surface of a cylinder. Most body parts are asymmetric and therefore an asymmetric magnet designed with a particular body part in mind would likely provide a more uniform field with less power consumption compared to a cylindrical magnet for imaging the same body part. The operation of dedicated MRI scanners could be substantially improved by effective asymmetric magnet designs.

Another concern with PMRI devices is that it is best for the electromagnet which provides the pulsed field (the polarizing magnet) to be a separate magnet from the magnet which provides the uniform field (the read-out magnet). Therefore, to build a PMRI device, the read-out magnet and the polarizing magnet must fit together such that the pulsed field from the polarizing magnet and the uniform field from the read-out magnet overlap. The problem of designing mechanically compatible read-out and polarizing magnets is greatly simplified if the read-out magnet is asymmetric.

However, it is very difficult with present magnet design techniques to design magnets of arbitrary geometry which produce uniform magnetic fields or any specific predetermined magnetic field. It is particularly difficult to design asymmetric magnets such that they consume a minimum of electrical power for a given desired field. Some magnet designs unnecessarily utilize 'negative currents' to provide a uniform field, but at the expense of greatly increased power consumption. It would be an advance in the art of MRI to be able to design asymmetric magnets in accordance with arbitrary geometrical constraints which consume a minimum of power. Also, it would be an advance in the art to provide a magnet design technique which designs magnets using negative currents only when absolutely necessary.

Asymmetric magnets are not commonly used in MRI or in other applications which require strong, uniform magnetic fields. The term 'asymmetric' herein refers to asymmetry across a plane perpendicular to the axis of rotational symmetry. FIG. 1A shows a cross sectional view of an symmetric magnet and FIG. 1B shows an example of a asymmetric magnet. Asymmetric magnets are not used because they are difficult to design, and particularly difficult to design such that they consume minimal power. This is unfortunate because asymmetric magnet designs can increase access to the magnetic field. Particularly, asymmetric magnet designs could improve the operation of and lower the cost of dedicated MRI scanners for scanning specific body parts.

Asymmetric magnets which provide uniform fields could also be used in any application which requires inexpensive, high performance magnets of arbitrary geometry.

More generally, the art of magnet design could benefit from a technique for designing magnets which can always find the lowest power coil layout for a desired magnetic field. Often, the coil layout which consumes the least power is also the cheapest to build. It would be an additional benefit if a magnet design technique could design magnets to conform to arbitrary geometrical constraints.

U.S. Pat. No. 4,721,914 to Fukushima et al. discloses an asymmetric magnet design which uses two coils having different radii. Fukushima's apparatus is limited to asymmetric magnets with two coils and cannot provide magnets which are compatible with arbitrary geometrical constraints. Also, Fukushima's apparatus produces an impractically inhomogeneous magnetic field for use with MRI devices.

U.S. Pat. No. 5,250,901 to Kaufman et al. discloses an asymmetric magnet having a single coil. The apparatus of Kaufman is limited in that Kaufman does not disclose asymmetric designs having more than one coil. Also, Kaufman relies upon ferromagnetic yokes. Ferromagnetic yokes are not compatible with some magnet applications such as PMRI which requires pulsed fields.

U.S. Pat. No. 5,659,281 to Pissanetzky et al. discloses a method for designing electromagnets and magnets which can be designed by the method. Pissanetzky's method often relies heavily on negative currents to achieve field homogeneity and therefore in many cases resistive electromagnet designs arrived at by Pissanetzky's method will not consume the least power possible for a desired field and desired magnet geometry. Analogously, superconducting magnet designs arrived at by Pissanetzky's method will not utilize the shortest length of superconducting wire possible. Pissanetzky's magnets are also characterized in that some of the magnet coils will have different current densities. Electromagnet coils designed for the same current density have the advantage that they can be connected in series and simply manufactured using wire of uniform size throughout.

Homogenous magnet designs with a small (typically less than 12) number of coils require the selection of the z location, radii and currents for each coil. The field profile is a non-linear function of the coils' z location and radii, whereas it is a linear function of the current. Hence, most classical magnet design techniques developed to date use non-linear optimization algorithms, which tend to be slow and are not guaranteed to converge to a reasonable magnet design. It would be an advance in the art of magnet design to find a method that did not require nonlinear optimization.

Hoult (*Journal of Magnetic Resonance,* 1994, vol 108, no 9, 1994) proposed a method to implements a concept using a pseudoinverse matrix to calculate coil currents in each of a number of virtual coils. The technique minimizes the magnet power (a virtue of the pseudoinverse algorithm) subject to exactly enforcing the homogeneity constraint. However, Hoult's technique does not minimize the number of coils, so a magnet built according to Hoult requires an impractical number of coils. In fact, a magnet built according to Hoult will have the same number of coils as the number of virtual coils used in the calculation.

Kitamura (1994, *IEEE Transactions on Magnetics,* Vol 30, no.4, page 2352) discloses a technique for minimizing the total volume of superconducting wire subject to constraints on the size of the spherical harmonic coefficients (a measure of field inhomogeneity). Kitimura's method can only design magnets which produce a spherical predetermined field. The initial phase of Kitamura's algorithm develops an initial current distribution on a cylinder that serves as a starting point for further nonlinear calculations with a superconducting coil and ferrous yoke.

OBJECTS AND ADVANTAGES OF THE INVENTION

Accordingly, it is a primary object of the present invention to provide electromagnets that:
1) comprise an assembly of coils arranged on an arbitrary surface of rotation such as an asymmetric surface of rotation;
2) consume the least amount of power possible (for resistive electromagnets) or require the least amount of superconducting wire possible (for superconducting magnets) for a given predetermined axial magnetic field and desired coil geometry;
3) do not require ferromagnetic pole pieces and therefore can be used in pulsed field applications which also require accurate magnetic field distributions;
4) utilize substantially the same current density in all coils.

It is also an object of the present invention to provide a method of designing electromagnets that:
1) provides the coil layout which minimizes the required amount of electrical power or superconducting wire for a given magnetic field and given coil geometry;
2) can provide a large number of magnet designs including symmetric and asymmetric designs;
3) can be relatively easily programmed using standard mathematics software;
4) can be used to design magnets comprising an assembly of coils disposed on an arbitrary surface of rotation;
5) can be used to design magnets which produce predetermined axial magnetic fields such as homogeneous magnetic fields or gradient fields;
6) does not require any nonlinear calculations;
7) is guaranteed to converge to an optimized magnet design;
8) can be used to design magnets which produce a predetermined axial magnetic field of arbitrary (rotationally symmetric) shape;
9) can be used to design magnets which have elliptical coils (and can therefore be rotationally asymmetric).

These and other objects and advantages will be apparent upon reading the following description and accompanying drawings.

SUMMARY OF THE INVENTION

These objects and advantages are attained by an electromagnet which provides a predetermined axial magnetic field. The electromagnet comprises at least three magnet coils which carry substantially the same current density. The coils are arranged coaxially along a Z-axis. The coils are located within a predetermined coil region. The coil region is shaped to allow an object to access the axial magnetic field. The electromagnet comprises no ferromagnetic magnetic circuit elements such as magnetic yokes.

The radius, Z-position, and total current of each coil is selected such that the electromagnet is optimized. For resistive electromagnets optimization means that the electromagnet requires the least amount of power possible for the predetermined axial magnetic field and the predetermined coil region. For superconducting electromagnets optimization means that the electromagnet requires the shortest length of wire possible for the predetermined axial magnetic field and the predetermined coil region. Also, an optimized magnet according to the present invention will have the least number of coils possible for a given predetermined axial magnetic field and predetermined coil region.

The coil region can have any arbitrary shape. Also, the field region can have any arbitrary shape. The predetermined axial magnetic field can be any arbitrary axial magnetic field. For example, the field can be a homogeneous magnetic field. The coils can be circular or elliptical.

The magnet can be designed such that it is shaped to allow a human body part to access the axial magnetic field. For example, the magnet can have a funnel shape with a large diameter end to fit around the shoulders so that a human head can access the predetermined axial magnetic field.

The magnet of the present invention can be used as a read-out magnet (the uniform field magnet) in a prepolarized MRI device. The read-out magnet can be shaped such that it mechanically fits with a polarizing magnet that provides a pulsed polarizing magnetic field.

The optimized magnets of the present invention can have coils arranged asymmetrically in an arbitrary shape. Asymmetric shapes can be useful in allowing objects to access the axial magnetic field. The magnets of the present invention can also be symmetric and have noncylindrical or nonspherical shapes.

Most optimized magnets according to the present invention will have spatially separated coils.

The most useful optimized magnets according to the present invention will not require any negative currents. In other words, the magnet produces the predetermined axial magnetic field when operated such that electrical currents in all the coils circulate in the same direction.

Most optimized magnets according to the present invention will have coils sized and located such that each coil is adjacent to the minimum radius of the coil region. Therefore, for most optimized magnet designs, the coils define an inner boundary of the coil region. The coils can be shaped and sized so that they are conformal to the object which accesses the magnetic field.

Many useful magnet designs will have a coil region which can be defined as a minimum coil radius as a function of Z-position. In other words, each given Z-position has an associated minimum radius for a coil located at the given Z-position.

The present invention also provides an electromagnet which provides a predetermined axial magnetic field wherein the magnet has at least three magnet coils arranged asymmetrically. The magnet coils carry the same current density. The coils are located to allow an object to access the axial magnetic field. The electromagnet comprises no ferromagnetic magnetic circuit components such as magnetic yokes.

The present invention includes a method of producing optimized electromagnets where the electromagnet produced is optimized for a given predetermined axial magnetic field and a predetermined coil region within which coils are located. The coil region can be any arbitrary shape of rotation. A current density value is selected. The current density value can be selected to be the maximum current density practicable for an electrical conductor to be used in the electromagnet. A number of target points are selected. A desired axial magnetic field is selected for each target point, thus defining the predetermined axial magnetic field to be created by the magnet. A number of virtual coils are defined within the coil region. The virtual coils are coaxial and can be circular or elliptical. Next, a power expression is defined for the total power dissipation in the electromagnet. The power expression is proportional to the total power dissipation in the magnet. The power expression has the form $$P_1|i_1|+P_2|i_2|+P_3|i_3|+ \ldots +P_k|i_k|,$$

where P is the circumference of each virtual coil and i is the total current in each virtual coil. A field homogeneity constraint is defined for the maximum magnetic field deviation from the desired axial magnetic field at each target point. Next, a calculation equivalent (isomorphic) to a $L^1$-norm minimization calculation is established wherein the power expression is minimized subject to the constraint of the field homogeneity constraint. Then, the calculation is solved, which provides the currents for each of the virtual coils. Magnet coils which correspond to the currents in the virtual coils as calculated can then be built.

The method can be repeated for nested regions within the original coil region. This results in a more precise magnet design.

DESCRIPTION OF THE FIGURES

FIGS. 1A and 1B illustrate the meanings of the terms 'symmetric' and 'asymmetric', respectively.

DETAILED DESCRIPTION

Figure 2:
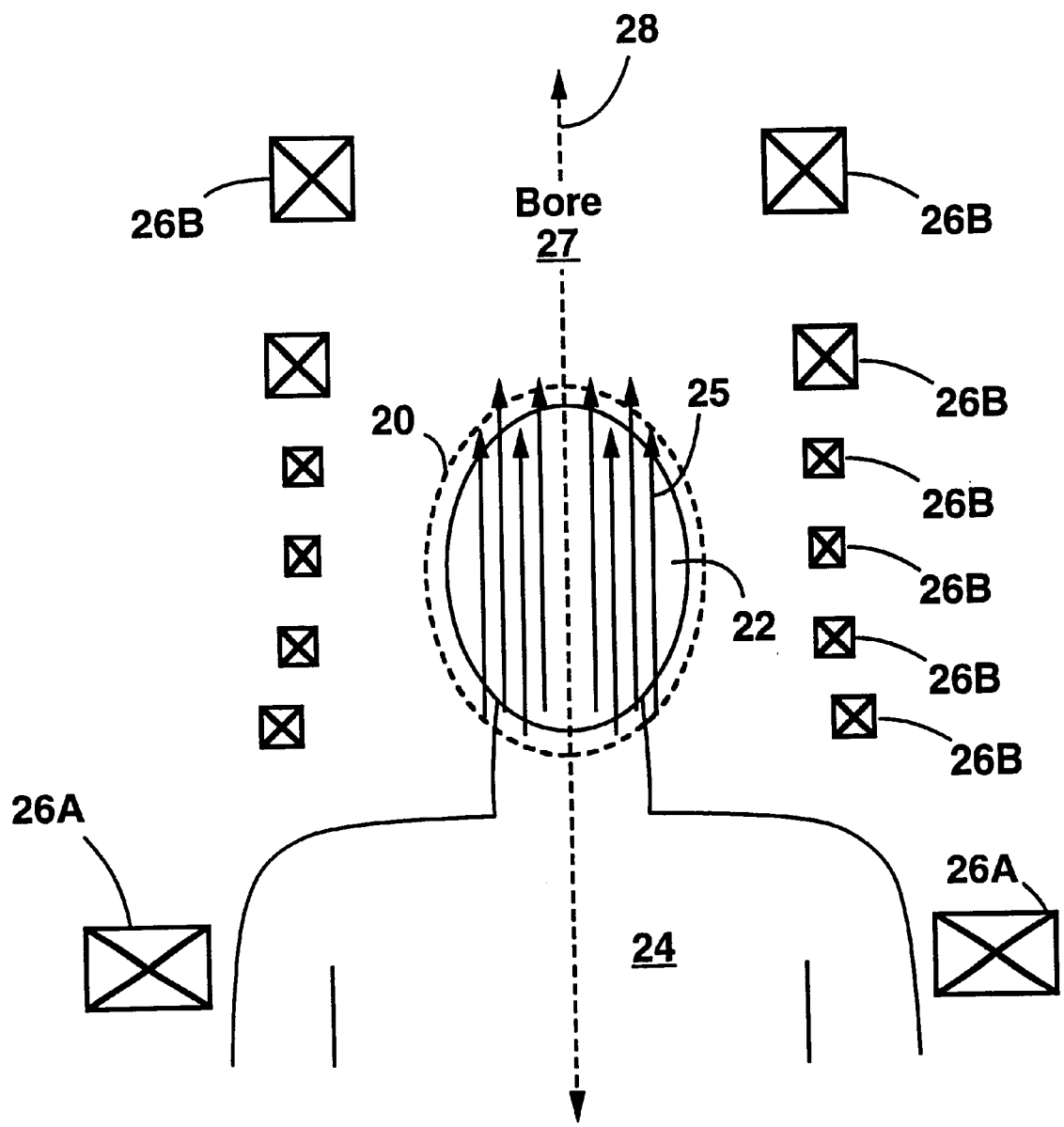
FIG. 2 shows an asymmetric magnet according to the present invention which can be used in a head-imaging MRI device.

A specific embodiment of an electromagnet according to the present invention is shown in FIG. 2. The electromagnet provides a predetermined axial magnetic field 25 approximately in the field region 20. In this specific example, the predetermined magnetic field is a homogenous magnetic field. The field region 20 of the predetermined magnetic field 25 is elliptical. The homogeneous magnetic field allows magnetic resonance imaging to be performed on the head 22 of a human patient 24 located within the bore 27 of the magnet.

Coils 26 are located coaxially along a Z-axis 28. Preferably, the coils 26 are circular, but the present invention also includes the possibility of using elliptical coils. The electromagnet is asymmetric about any plane perpendicular to the Z-axis 28. The bottom coil 26A has a larger radius and therefore can fit over the shoulders of the patient 24. Upper coils 26B located around the head 22 have smaller radii than the bottom coil 26A. This allows the upper coils 26B to be closer to the field region 20, thereby generating the homogeneous field 25 with a relatively small amount of power compared to a cylindrical coil with a radius equal to the radius of the bottom coil 26A. Also, the coils 26 carry the same current density. Therefore, the current in each coil 26 is proportional to the cross-sectional area of each coil. The coils 26 can be resistive or superconducting.

The currents in the coils 26 travel in the same rotational direction, i.e., there are no negative currents. This is a preferred feature of magnets according to the present invention. However, the present invention also includes magnets which have combinations of positive and negative currents.

The field region 20 is shown to be elliptical, but magnets according to the present invention can have field regions 20 with any rotationally symmetric shape. Dome or droplet-shaped field regions, for example, are possible.

Figure 3A:
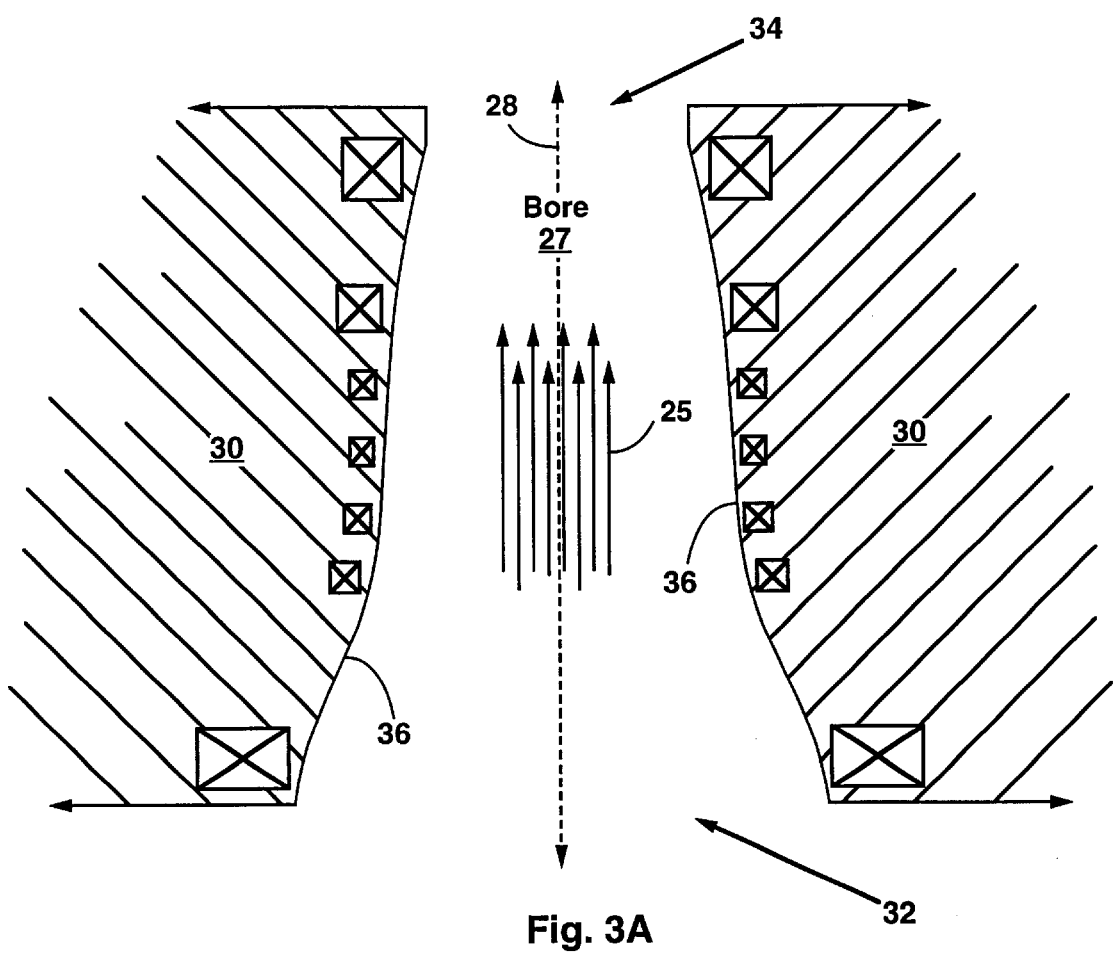
FIG. 3A shows the magnet of FIG. 2 without a human.

FIG. 3A shows the electromagnet of FIG. 2 without the human patient 24. The coils 26 are located within a coil region 30 which defines the bore 27. The coil region 30 and bore 27 are complementary shapes. The coil region 30 and bore 27 are separated by an inner boundary 36 which has a radius that varies with location along the Z-axis 28. All points within the coil region 30 are located outside a surface of rotation defined by the inner boundary 36. The bore 27 is a rotationally symmetric hole.

The bore 27 has a funnel shape which has a large diameter end 32 and a small diameter end 34. The large diameter end 32 is wide enough to accept the shoulders of a human. In the specific case of an electromagnet for a dedicated MRI scanner for imaging the head and neck, the large end 32 of the bore 27 has a diameter in the range of about 45–70 cm and the small end 34 has a diameter in the range of about 20–40 cm.

The magnet of FIGS. 2 and 3A is optimized. In the case of a resistive electromagnet, optimization means that the coils are located within the coil region 30 such that the predetermined axial field 25 is generated with the least amount of power possible. The predetermined axial magnetic field 25 is generated with the smallest amount of power consumption possible given the shape of the coil region 30 and the requirements of the homogeneous field 25 (flux density, uniformity, etc.). In the case of a superconducting electromagnet, optimization means that the magnet utilizes the shortest total length of superconducting wire possible for the given shape of the coil region 30 and the requirements of the homogeneous field 25 (flux density, uniformity, etc.). It is noted that, in the case of uniform current density, optimization in resistive magnets and superconducting magnets is mathematically equivalent, for the power consumption in a resistive magnet is directly proportional to the length of wire used.

The current density in each coil 26 is the same. Therefore, the current magnitude in each coil 26 is proportional to the cross sectional area of each coil 26. This is an essential feature of all magnets of the present invention as it is necessary in order to be able to design the optimized coil geometry.

Magnets according to the present invention have no ferromagnetic pole pieces, yokes or other ferromagnetic magnetic circuit components.

It is noted that an optimized magnet will almost always have every coil located at the smallest radius allowed by the coil region 30. Therefore, for most magnets, the coil region boundary 36 is defined by the locations and radii of the coils 26. Only in unusual cases such as extreme requirements of field uniformity or flux density will the coils have a radius substantially larger than that allowed by the boundaries 36 of the region 30.

It is also noted that the direction of current flow in an optimized magnet will likely be the same in all the coils 26. Only in unusual cases such as extreme requirements of field uniformity or restricted coil geometry will the coils 26 have currents which flow in different directions (negative currents).

It is further noted that the magnets according to the present invention can produce fields other than homogeneous fields. For example, magnets of the present invention can produce desired axial magnetic field Z-gradients.

Magnets built according to the present invention are optimized for a predetermined axial magnetic field 25 and predetermined coil region 30 in which the coils are located. The predetermined coil region 30 is designed such that an object can be placed in the predetermined axial magnetic field. Preferably, the coil region 30 is shaped so that the boundary 36 is conformal to the object to be placed in the predetermined axial magnetic field 25. In other words, the coil region 30 and an object to be placed in the magnetic field 25 have complementary shapes. In the example above, the coil region 30 is funnel shaped is complementary to the head and shoulders of a human (the object) to permit access to the homogeneous magnetic field 25. Most generally, the coil region 30 can have any arbitrary shape of rotational symmetry.

Figure 3B:
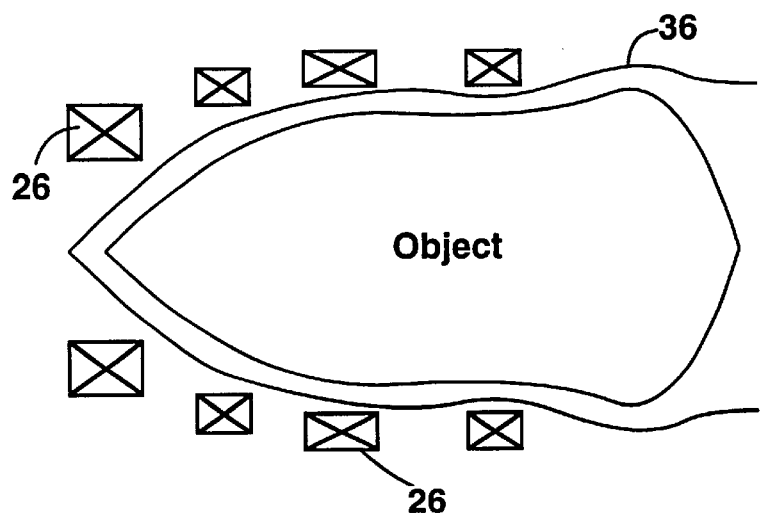
FIG. 3B shows a magnet and coil region boundary which are conformal to an object.

Also preferably, the magnet coils are located and sized such that they are conformal to an object to be placed in the predetermined magnetic field 25. This results, for example, if the coils are located adjacent to the boundary 36 and the boundary 36 is conformal to the object. FIG. 3B shows an example of a magnet having magnet coils which are conformal to an object to be placed within the magnetic field.

Figure 4:
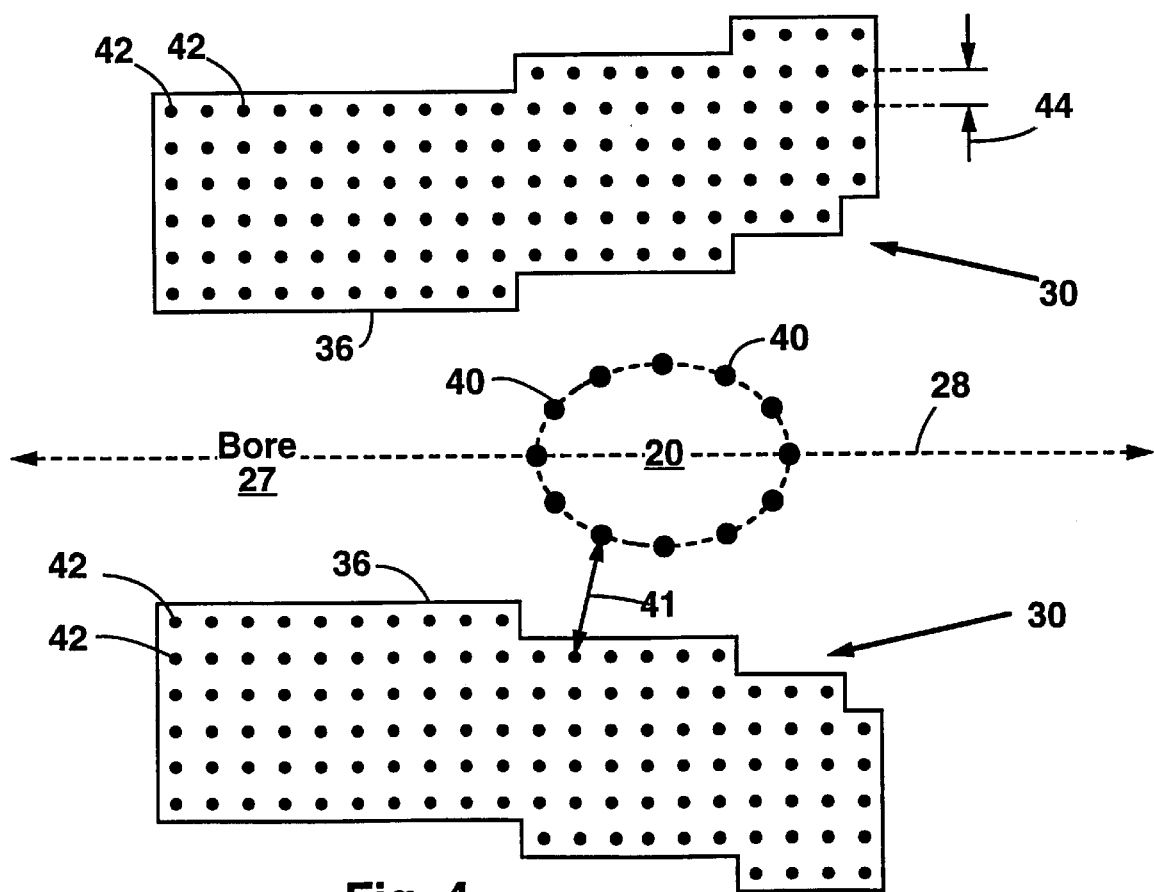
FIG. 4 shows a diagram illustrating how magnets of the present invention are built.

FIG. 4 shows the first steps in the manufacture of magnets according to the present invention. The steps illustrated in FIG. 4 are calculation steps and do not involve the construction of an apparatus. All the steps explained with reference to FIG. 4 can be performed on a computer. The Z-axis 28 is defined. The shape of the rotationally symmetric coil region 30 and bore 27 are defined. The bore 27 may have any arbitrary, rotationally symmetric shape and the coil region 30 may have any arbitrary, rotationally symmetric shape. The field region 20 is defined where a predetermined axial magnetic field is desired. The field region 20 may have any arbitrary, rotationally symmetric shape, but must be centered on the Z-axis 28.

A number of target points 40 are defined around the field region 20. Target points may also be defined within the field region 20. The target points 40 are arbitrarily numbered 1,2,3, . . . ,n and a magnetic field at each target point is given a variable $t_1, t_2, t_3, \ldots t_n$. Since the magnet design is to be rotationally symmetric, the target points need only be located on a plane parallel with the Z-axis 28.

Next, a predetermined axial magnetic field is defined for each target point 40. The predetermined axial magnetic field at each target point 40 is numbered $b_1, b_2, b_3, \ldots b_n$. Also, a maximum acceptable deviation from the predetermined axial magnetic field is defined for each target point. The maximum deviation at each target point is numbered $e_1, e_2, e_3, \ldots e_n$.

The coil region 30 is modeled to have a large number (typically about 100) of circular, coaxial virtual coils 42 located in a grid pattern. However, the virtual coils 42 can be located in any pattern. For the purposes of calculation, the virtual coils are assumed to be infinitesimally thin.

The virtual coils 42 are arbitrarily numbered 1, 2, 3, . . . , k. An unknown current variable is selected for each virtual coil 42. The unknown currents are numbered $i_1, i_2, i_3, \ldots i_k$ for the virtual coils 1, 2, 3, . . . , k., respectively. The currents $i_1, i_2, i_3, \ldots i_k$ are variables to be determined in the following calculations. The magnet design is complete when the currents $i_1, i_2, i_3, \ldots i_k$ are determined for all the virtual coils 42. The currents $i_1, i_2, i_3, \ldots i_k$ may have any value and magnitude: zero, positive or negative. A negative current value for a coil indicates that the current travels in a reverse direction.

In order to avoid errors due to the idealization of assuming the virtual coils 42 to be thin, the virtual coils 42 should be located a minimum distance 41 away from the target points 40. The distance 41 between the virtual coils 42 and target points 40 is about twice the distance 44 between neighboring virtual coils 42. Increasing the distance between the virtual coils 42 and target points 40 may increase the accuracy of the final magnet design. This can be done, for example, by using a denser grid of virtual coils 42.

Each virtual coil 42 represents a coil which may or may not exist in the final magnet when constructed. A particular virtual coil 42 will have a corresponding coil in the final magnet apparatus if the following calculations prescribe a nonzero current for the virtual coil 42.

The current density in each magnet coil of the magnet apparatus to be built is defined to be equal to a predetermined current density. The current density is the same for every magnet coil. The concept of current density is meaningless when applied to the virtual coils 42. Therefore, when constructed, the magnet coils will have a cross sectional area which is proportional to the current value $i_1$, $i_2$, $i_3$, ... $i_k$ calculated for the corresponding virtual coils 42.

Preferably, the predetermined current density is selected to be equal to a maximum possible current density. For resistive electromagnets, the maximum possible current density is established by a maximum amount of heating which is acceptable. For superconducting magnets, the maximum possible current density is established by the superconducting properties of the wire to be used.

The total power dissipation (Power=$I^2R$) in a magnet as a function of current and coil geometry is equal to the expression:

$$\text{Power} = \sum_k |i_k|^2 \left(\frac{2\pi r_k}{A_k \sigma_c}\right)$$

where $i_k$ is the current in the $k^{th}$ coil, $r_k$ is the radius of the $k^{th}$ coil, $A_k$ is the cross sectional area of the $k^{th}$ coil and $s_c$ is the conductivity of the coil conductor material.

The term $2pr_k$ is, of course, equal to the circumference of the $k^{th}$ circular coil.

The assumption of uniform current density in the magnet coils results in a simplified expression for the total power dissipation in the magnet. Since $$\frac{|i_k|}{A_k} = J = \text{Constant,}$$

where J is the current density, the factor J can be extracted from the summation in the power expression. Therefore, for a given uniform current density, the power expression can be simplified to:

$$\text{Power} = \left(\frac{2\pi J}{\sigma_c}\right) \sum_k r_k |i_k| = (\text{Constant}) \sum_k r_k |i_k|, \text{ therefore}$$

$$\text{Power} \propto r_1 i_1 + r_2 i_2 + r_3 i_3 + \ldots + r_k i_k.$$

Each virtual coil 42 contributes an axial magnetic field at each of the target points 40. The net axial magnetic field at each target point 40 can be expressed as a sum of the contributions from each virtual coil.

Net axial field at $n=t_n=G_{1n}i_1+G_{2n}i_2+G_{3n}i_3+\ldots+G_{kn}i_k$ where $G_{1n}$, $G_{2n}$, $G_{3n}$, ..., $G_{kn}$ are coefficients which express the relationship between the virtual coil currents and the axial magnetic field at the $n^{th}$ target point. For each target point there will be k coefficients. The coefficients $G_{kn}$ for all the target points can be calculated from the expression for the off-axis magnetic field produced by a single circular current loop. The expression for the off-axis magnetic field produced by a single circular current loop is well known. Reference can be made to *Electromagnetic Fields,* by J. Van Bladel, Hemisphere Publishing Corp. NY, 1985, P. 156 concerning calculations for the off axis magnetic field of a circular current loop.

Once the coefficients $G_{kn}$ are calculated for a particular combination of target points and virtual coils, a n×k G-matrix relating the currents in all the virtual coils with the fields at all the target points can be written. G has the form:

$$\begin{pmatrix} G_{11} & \ldots & G_{k1} \\ \vdots & \vdots & \vdots \\ G_{1n} & \ldots & G_{kn} \end{pmatrix} = (G)$$

We define the vectors (I) and (T):

$$\begin{pmatrix} i_1 \\ \vdots \\ i_k \end{pmatrix} = (I) \text{ and } \begin{pmatrix} t_1 \\ \vdots \\ t_n \end{pmatrix} = (T).$$

Therefore, G has the following property:

$$\begin{pmatrix} G_{11} & \ldots & G_{k1} \\ \vdots & \vdots & \vdots \\ G_{1n} & \ldots & G_{kn} \end{pmatrix} \begin{pmatrix} i_1 \\ \vdots \\ i_k \end{pmatrix} = \begin{pmatrix} t_1 \\ \vdots \\ t_n \end{pmatrix}, \text{ or } (G)(I) = (T)$$

The predetermined axial magnetic fields ($b_1$, $b_2$, $b_3$, ... $b_n$) and maximum deviations ($e_1$, $e_2$, $e_3$, ... $e_n$) at each target point can also be expressed as vectors (B) and (E):

$$(B) = \begin{pmatrix} b_1 \\ \vdots \\ b_n \end{pmatrix}, E \begin{pmatrix} \varepsilon_1 \\ \vdots \\ \varepsilon_n \end{pmatrix}$$

A field homogeneity constraint which relates the predetermined axial magnetic field vector B, the current vector I, and the maximum deviation vector E to the coefficients $G_n$ (in the G-matrix) can be written as:

$$|(G)(I) - (B)| \leq (E).$$

The task of designing an optimized electromagnet can now be succinctly expressed in two equations. The problem of designing an optimized electromagnet is solved by performing the following calculation:

$$\text{Minimize the power expression:} \sum_k r_k |i_k|,$$

Subject to the field homogeneity constraint: $|(G)(I)-(B)| \leq (E)$

This is known as a weighted $L^1$-norm minimization problem which has several fortunate characteristics: 1) it can be cast as a linear programming problem and solved very efficiently using standard software (such as MATLAB); 2) a global minimum solution (corresponding to an optimized magnet design) can always be found; and 3) it automatically picks the minimum number of non-zero-current coils.

The design method therefore will always produce the optimal magnet design for the given predetermined axial magnetic fields at the target points 40 and the given shape of the coil region 30. Also, the method will prescribe the least number of coils possible.

A resistive electromagnet built according to the method of the present invention will consume the least amount of power possible for the given predetermined axial magnetic fields at the target points 40 and the given shape of the coil region 30.

A superconducting electromagnet built according to the method of the present invention will have the shortest length of superconducting wire possible for the given predetermined axial magnetic fields at the target points 40 and the given shape of the coil region 30. The $L^1$-norm calculation for the superconducting case is set up slightly differently. The 'power' expression (which really expresses the total conductor length) is slightly different:

$$\text{Minimize the power expression: } \sum_k r_k \frac{|i_k|}{J},$$

Subject to the field homogeneity constraint: $|(G)(I)-(B)| \leq (E)$.

Solving the above $L^1$-norm problem will determine the values for $i_1, i_2, i_3, \ldots, i_k$. Most currents $i_1, i_2, i_3, \ldots, i_k$ will be equal to zero. Actual apparatus coils can be constructed which correspond to the current values $i_1, i_2, i_3, \ldots, i_k$ at the locations of the virtual coils. In order to achieve optimization, the coils should be constructed such that they carry the same current density. Therefore, the cross sectional area of a particular coil will be proportional to the corresponding current $i_k$. When the magnet is constructed, the magnet coils should be located such that the corresponding virtual coil is centered on the magnet coil.

Figure 5:
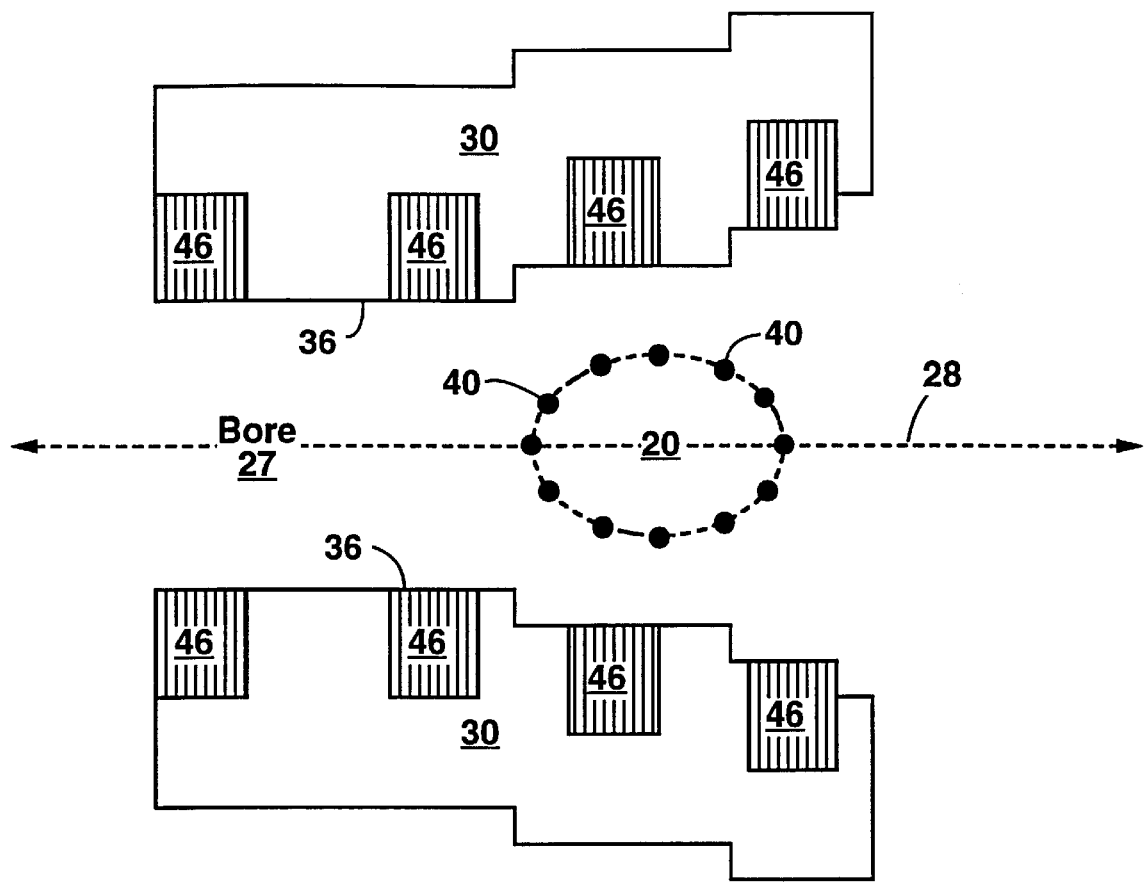
FIG. 5 shows how nested regions within a coil region can be used to reiterate the method of designing magnets according to the present invention.

The calculation outlined above can be reiterated for smaller and smaller nested regions. This can increase the accuracy of the magnet design. FIG. 5 shows nested regions 46 for which a first pass of the calculation prescribed nonzero current. In this example, all the virtual coils 42 located outside the regions 46 were calculated to carry zero current. The nonzero-current nested regions 46 are, of course, located within the original coil region 30. The calculation outlined above can be repeated for the nested regions 46. Since the nested regions 46 are smaller than the original coil region 30, virtual coils can be placed more densely within the nested regions 46 without exceeding the computational complexity required for the first iteration. The second iteration will therefore more accurately prescribe the currents necessary. The calculation can be repeated 2, 3 or more times. If desired, each virtual coil in the nested regions 46 can correspond to a single wire loop in the electromagnet.

Figure 6:
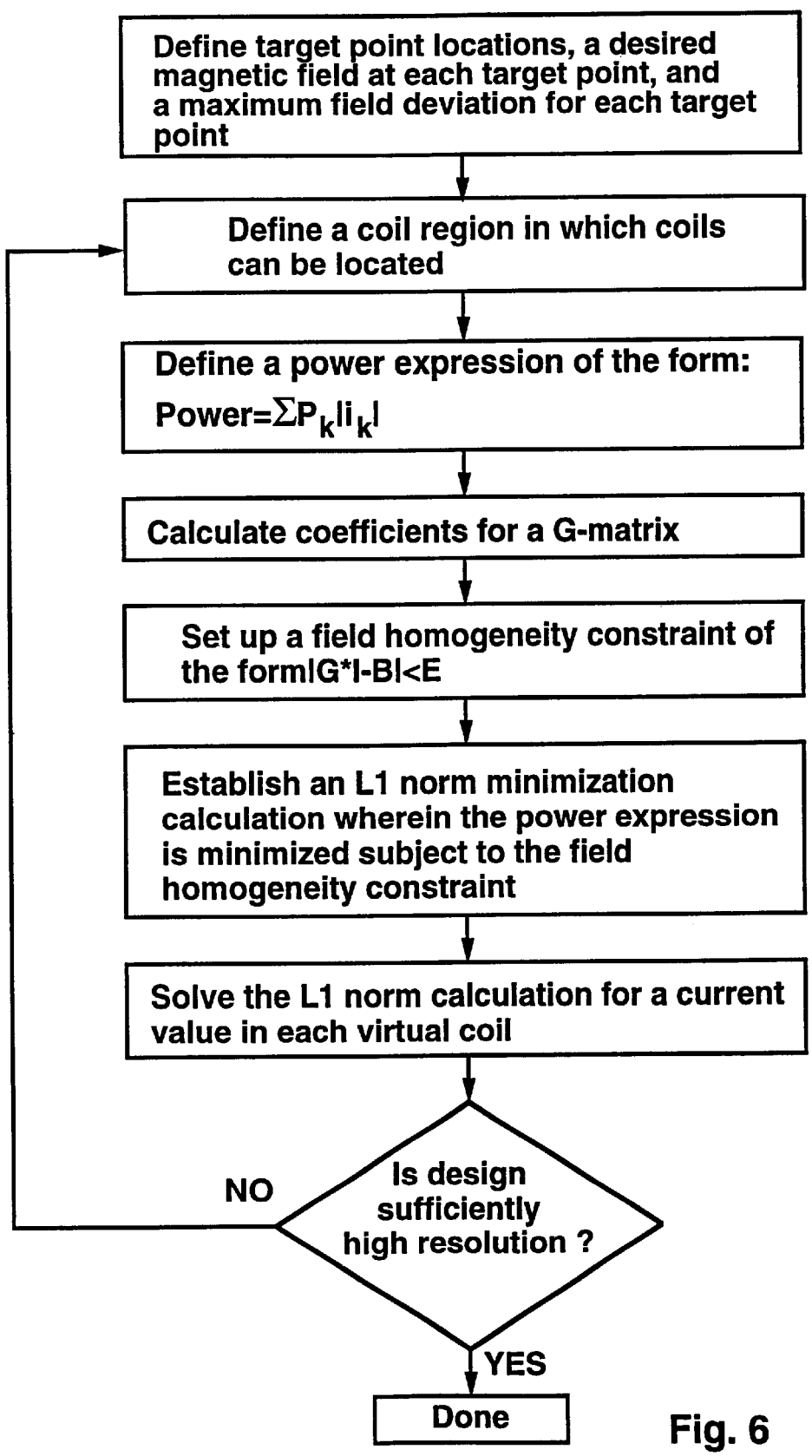
FIG. 6 is a flow diagram which illustrates the steps in designing magnets according to the present invention.

A flow diagram illustrating the design method is shown in FIG. 6. It can be clearly seen from this flow diagram that if the design process is reiterated, the target point locations, the predetermined axial magnetic field values at the target points and the maximum field deviations at the target points should remain unchanged in each reiteration.

It is noted that there may exist mathematical calculations which are equivalent (isomorphic) to calculating the solution to an $L^1$-norm minimization problem. Obviously, a calculation which is isomorphic to $L^1$-norm minimization calculations can also be used in the present invention.

Figure 7A:
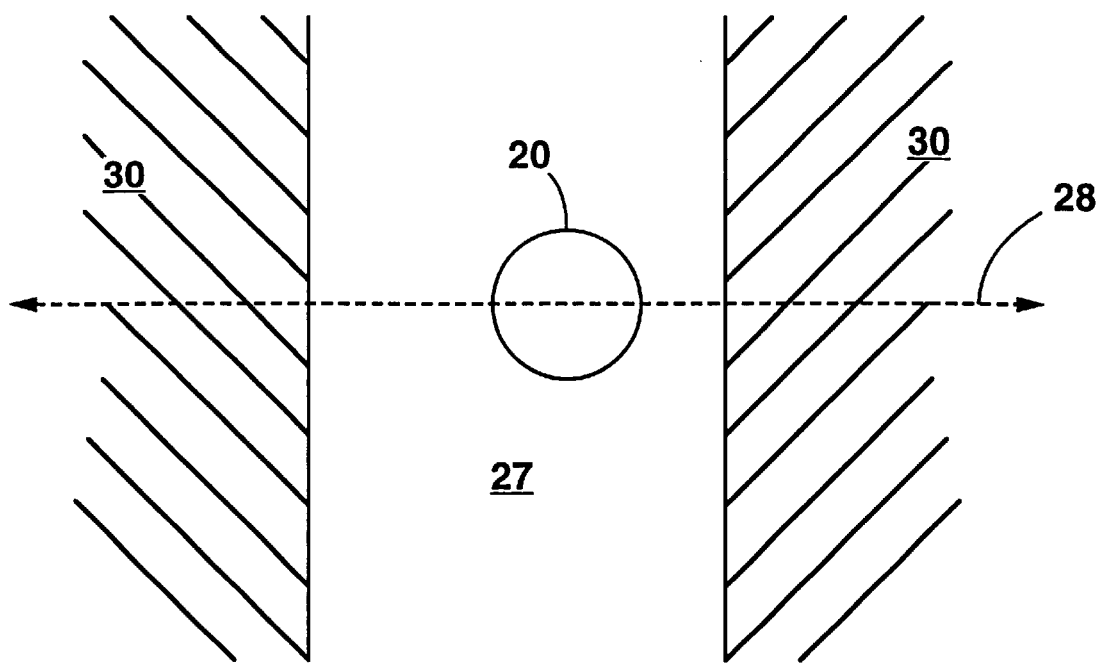
FIGS. 7A and 7B illustrate coil regions of various shapes possible in the present invention.
Figure 7B:
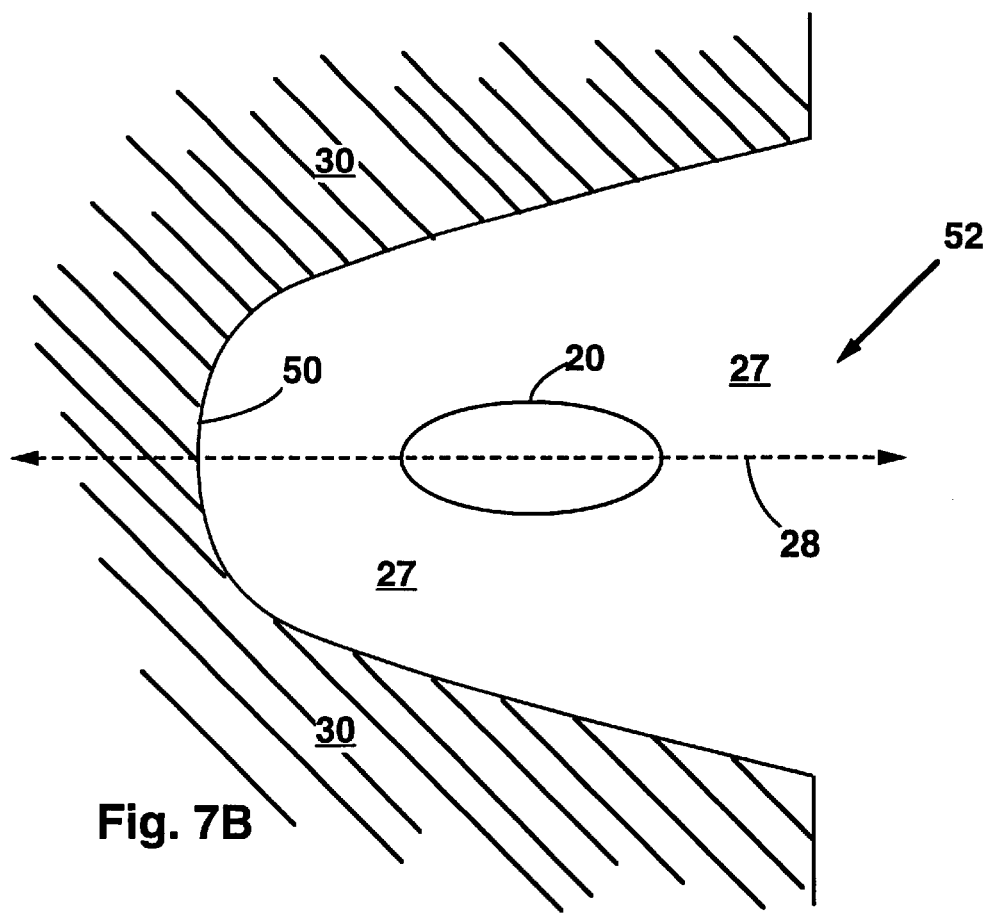

It is significant that coil region 30 and bore 27 can have an arbitrary rotationally symmetric shape in the present invention. This allows optimized electromagnets to be designed which can accommodate objects of awkward shape. FIGS. 7A–7B show various bore shapes 27, coil regions 30 and field regions 20 for which optimized magnets can be designed.

In FIG. 7A, the bore 27 is disc shaped and it is seen edge-on. Access to the field region 20 is made through the edge of the bore 27 and not through (circular) ends of the bore 27, where openings through the coil region 30 do not exist. Also, the field region 20 is not centered inside the bore 27 between the two sides of the coil region 30. This asymmetry indicates that coils designed for producing the field in the off-center field region 20 must also be asymmetric.

In FIG. 7B, the bore 27 is bowl-shaped with a closed end 50 and an open end 52. An object can access the field region 20 through the open end 52.

It has been mentioned that asymmetric magnet designs can be of particular advantage in applications where objects of awkward shape need to access the magnetic field. Symmetric shapes can also provide advantages in this regard. In particular, noncylindrical and nonspherical symmetric shapes can be useful for certain applications such as MRI. There exist many cylindrical and spherical magnet designs in the prior art, although they are not necessarily optimized. Cylindrical magnet designs locate magnet coils on a cylinder coaxial with the magnet axis: all the coils have the same radius. Spherical magnet designs locate magnet coils on the surface of a sphere centered on the magnet axis. The coils are located such that they define a sphere.

Figure 8:
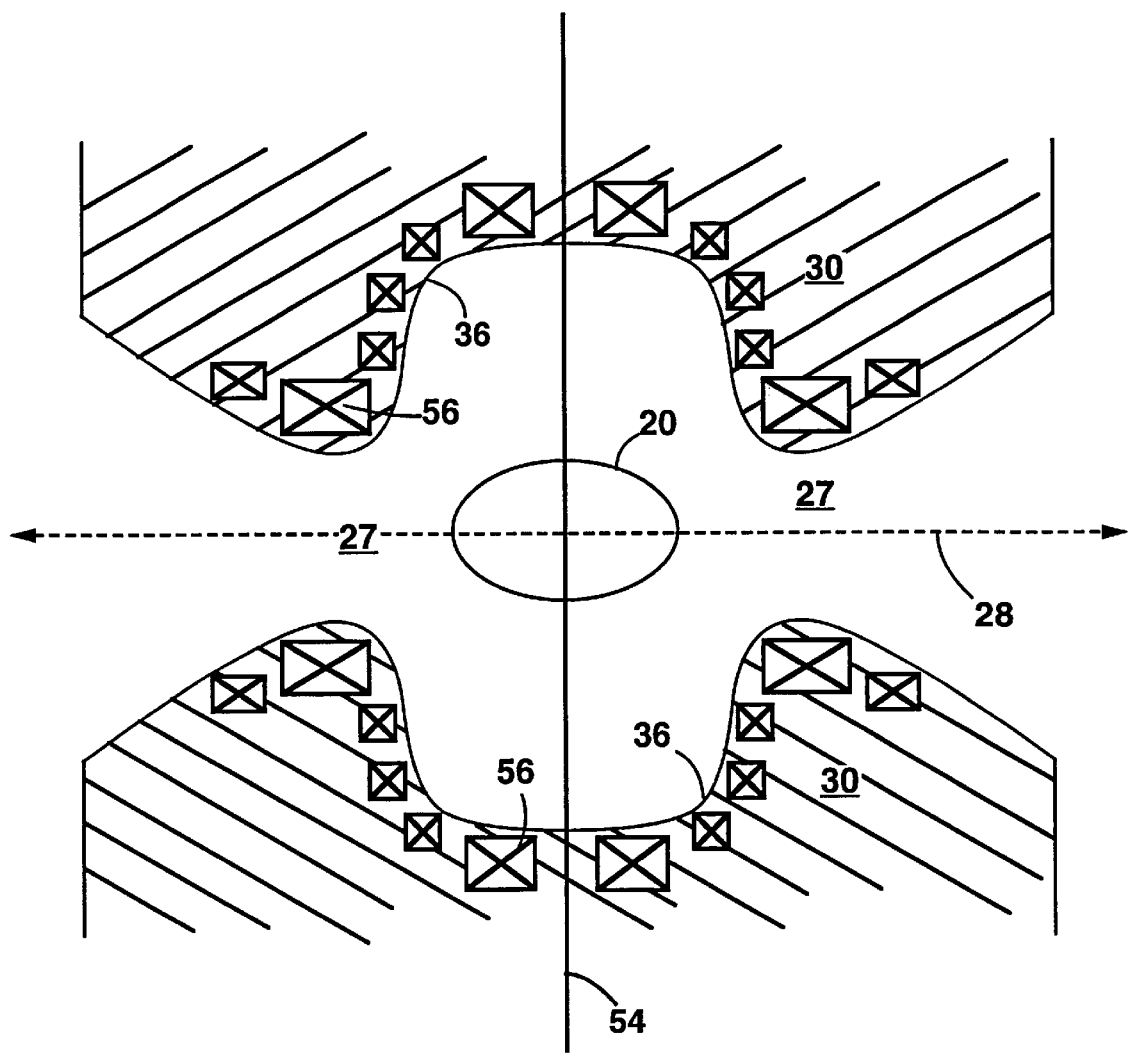
FIG. 8 is an example of a symmetric, nonspherical, noncylindrical magnet and coil region.

FIG. 8 illustrates a noncylindrical nonspherical symmetric magnet design. The coil region 30, field region 20, and magnet coils 56 are symmetric about a symmetry plane 54 which is perpendicular to the Z-axis 28. The present invention includes such noncylindrical nonspherical symmetric optimized magnet designs. The method of the present invention can be used to build optimized magnets having such arbitrary shapes.

FIG. 8 also illustrates a common characteristic of magnets according to the present invention. The magnet coils 56 are located at the smallest radius defined by the coil region 30. The magnet coils 56 are located adjacent to the boundary 36. Therefore, for most optimized magnets built according to the present method, the magnet coils 56 will outline the boundary 36 of the coil region 30. This characteristic is almost always true for symmetric and asymmetric magnets.

Some magnets, however, will not have magnet coils 56 which are located adjacent to the coil region boundary 36. This occurs when the desired axial magnetic field is difficult to produce. For example, if an extremely homogeneous axial magnetic field or a particularly large volume (relative to the magnet length) homogeneous axial magnetic field is desired, then the optimized design may have coils located away from the boundary 36. In other words, the magnet coils may have radii which are greater than the minimum established by the boundary 36.

Prepolarized MRI systems will use two magnets: a polarizing magnet and a read-out magnet. The read-out magnet provides the constant, homogeneous axial magnetic field and the polarizing magnet provides the pulsed, nonhomogeneous magnetic field. The polarizing magnet and the read-out magnet must provide pulsed and uniform fields, respectively, in substantially the same region of space (the field region 20). Therefore, the polarizing and read-out magnets must have shapes which allow them to be mechanically fit together such that their respective magnetic fields overlap. The ability to design magnets of arbitrary shape is quite useful in producing magnets which can be fit together.

Figure 9:
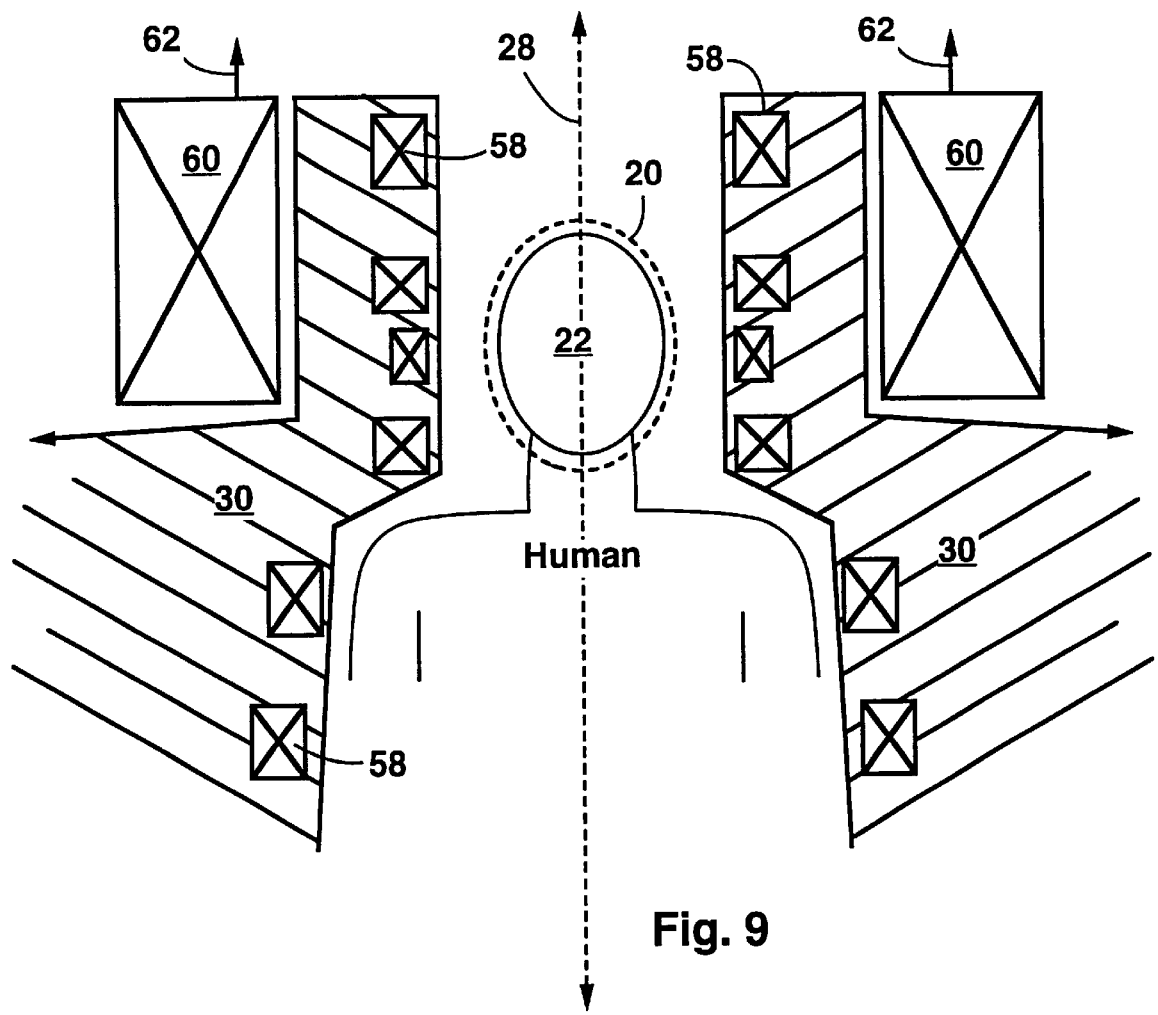
FIG. 9 shows how magnets according to the present invention can be shaped to mechanically fit with a polarizing magnet in a prepolarized MRI device.

FIG. 9 shows an example of a read-out magnet 58 and polarizing magnet 60 which can be used to perform prepolarized MRI on a human head 22. The read-out magnet 58 and polarizing magnet 60 fit together so that the polarizing magnet 60 can be removed from the read-out magnet by sliding in the direction of the arrows 62. This allows the polarizing magnet 60 and read-out magnet 58 to be built separately and then assembled. It is noted that the polarizing magnet 60 does not need to be accurately positioned with respect to the read-out magnet 58 because the polarizing magnetic field is very nonhomogeneous compared to the read-out magnetic field.

The present invention includes magnets having elliptical coils. A method for designing magnets with elliptical coils is very similar to the method described above. Target points are chosen with a predetermined axial magnetic field at each target point. In the case of elliptical coils, the magnet is not rotationally symmetric, so the magnetic field produced will not be rotationally symmetric. Therefore, the target points must be located in 3-dimensional space. The target points can be located on a 3-dimensional surface which encloses the volume to have the desired axial magnetic field. For example, in the case of a homogeneous magnetic field volume, the target points can lie on the surface of the volume to have a homogeneous magnetic field.

Figure 10:
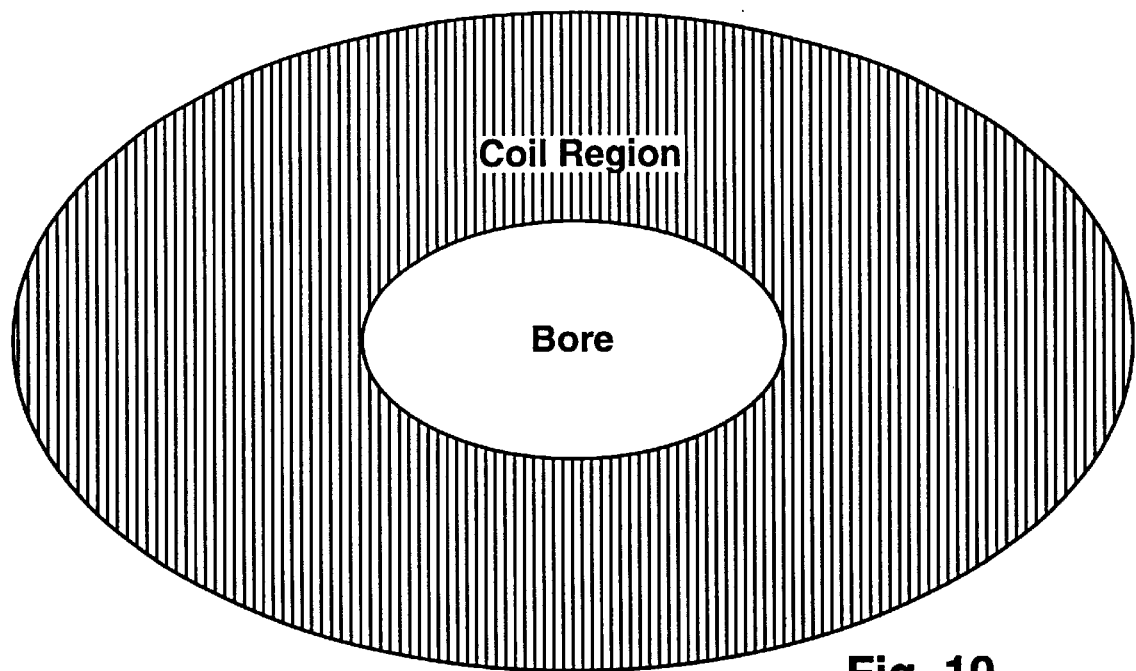
FIG. 10 is an end-on view of an elliptical magnet with an elliptical bore and elliptical coil region.

FIG. 10 shows an end-on view of a possible bore shape and coil region shape. The bore can be an elliptical solid shape and it can be tapered or untapered. The bore, for example, can have a shape of an elliptical extrusion. The bore may have any arbitrary shape and the coil region may have any arbitrary shape. It can be appreciated that an elliptical bore shape can efficiently fit a human body shape with less wasted bore space than a cylindrical bore shape. This is because humans are typically wider than they are thick and so are elliptically shaped.

Figure 11:
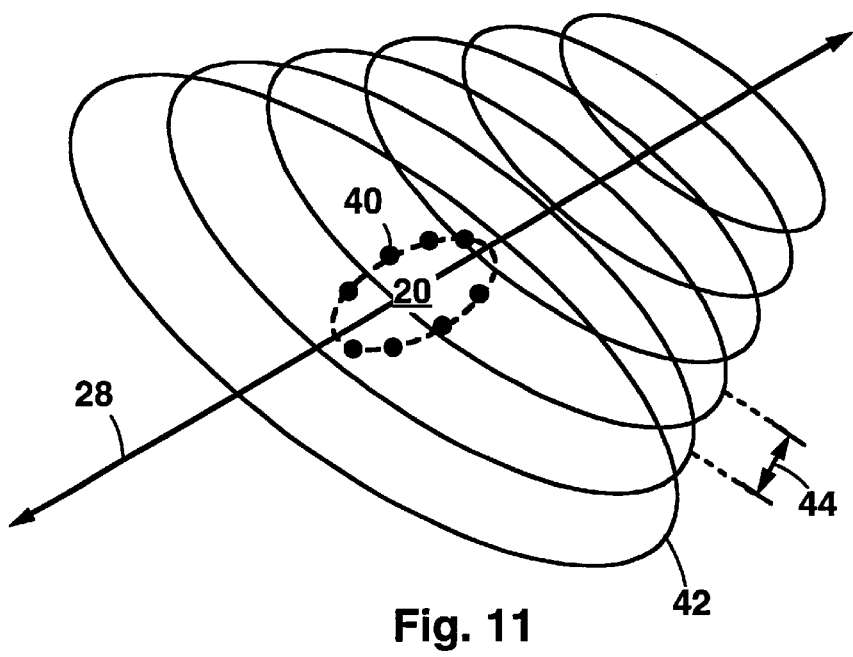
FIG. 11 is a diagram illustrating how magnets having elliptical coils of the present invention are built.

FIG. 11 shows the first steps in the manufacture of elliptical magnets according to the present invention. The steps illustrated in FIG. 10 are calculation steps and do not involve the construction of an apparatus. All the steps explained with reference to FIG. 10 can be performed on a computer. The Z-axis 28 is defined. The shape of the coil region and bore are defined. For clarity, the coil region and bore are not shown in FIG. 10. The field region 20 is defined where a predetermined axial magnetic field is desired. The field region 20 may have any arbitrary shape, but must be centered on the Z-axis.

Target points 40 and elliptical virtual coils 42 are defined. Since a magnet design with elliptical is rotationally asymmetric, the target points 40 must be located in 3-dimensional space around the Z-axis 28. The elliptical virtual coils 42 can have the same eccentricity or different eccentricities. The virtual coils 42 can even be a mixture of circular and elliptical virtual coils. However, it is preferable for the elliptical virtual coils to have the same eccentricity. For clarity, only a small number of virtual coils are shown in FIG. 10.

As in the case of circular magnet design, the target points 40 should be located a minimum distance from the virtual coils which is greater than the spacing between virtual coils 44.

The design of magnets with elliptical coils is very similar to the design of magnets with circular coils as described above. An important difference is that the power expression becomes:

$$\text{Power} = \sum_k |i_k|^2 \left(\frac{P_k}{A_k \sigma_c}\right)$$

where $i_k$ is the current in the $k^{th}$ coil, $P_k$ is the circumference of the $k^{th}$ coil, $A_k$ is the cross sectional area of the $k^{th}$ coil and $s_c$ is the conductivity of the coil conductor material.

The G-matrix will be different for elliptical coils. The coefficients $G_{kn}$ can be calculated from the expression for the off axis magnetic field produced by a single elliptical current loop. Also, the coefficients $G_{kn}$ for elliptical coils can be numerically calculated from Ampere's law.

The task of designing an optimized electromagnet with elliptical coils can now be succinctly expressed in an $L^1$-norm minimization calculation:

$$\text{Minimize the power expression:} \sum_k rP_k |i_k|,$$

Subject to the field homogeneity constraint: $|(G)(I)-(B)| \leq (E)$.

The method of designing magnets with elliptical coils can be considered to be a more general method than the method of designing circular magnets. The method of designing elliptical magnets uses a set of elliptical virtual coils instead of a set of circular virtual coils. Also, magnet designs having combinations of circular and elliptical magnet coils can be created by including both circular and elliptical virtual coils in the original set of virtual coils.

Figure 12:
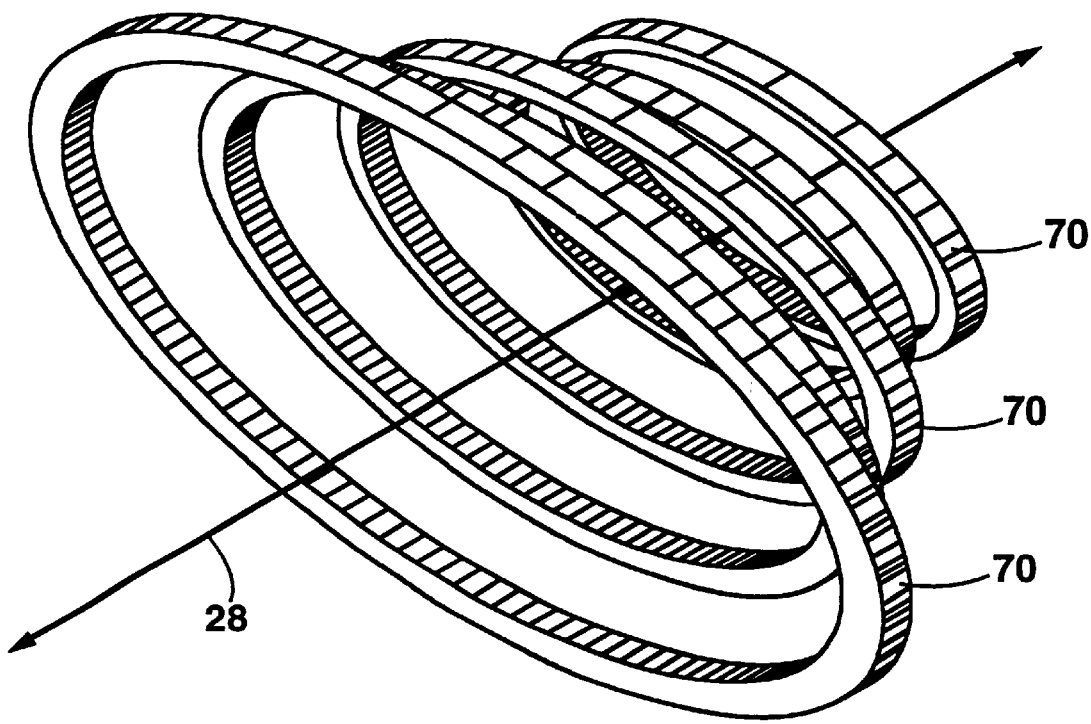
FIG. 12 shows a magnet having elliptical coils where the elliptical coils have the same eccentricity.

The present invention includes magnets having elliptical magnet coils. FIG. 12 shows a magnet with 5 elliptical coils 70. The coils are coaxial and the Z-axis 28 extends through the center of each elliptical coil (through the midpoint between the ellipse foci).

Figure 13:
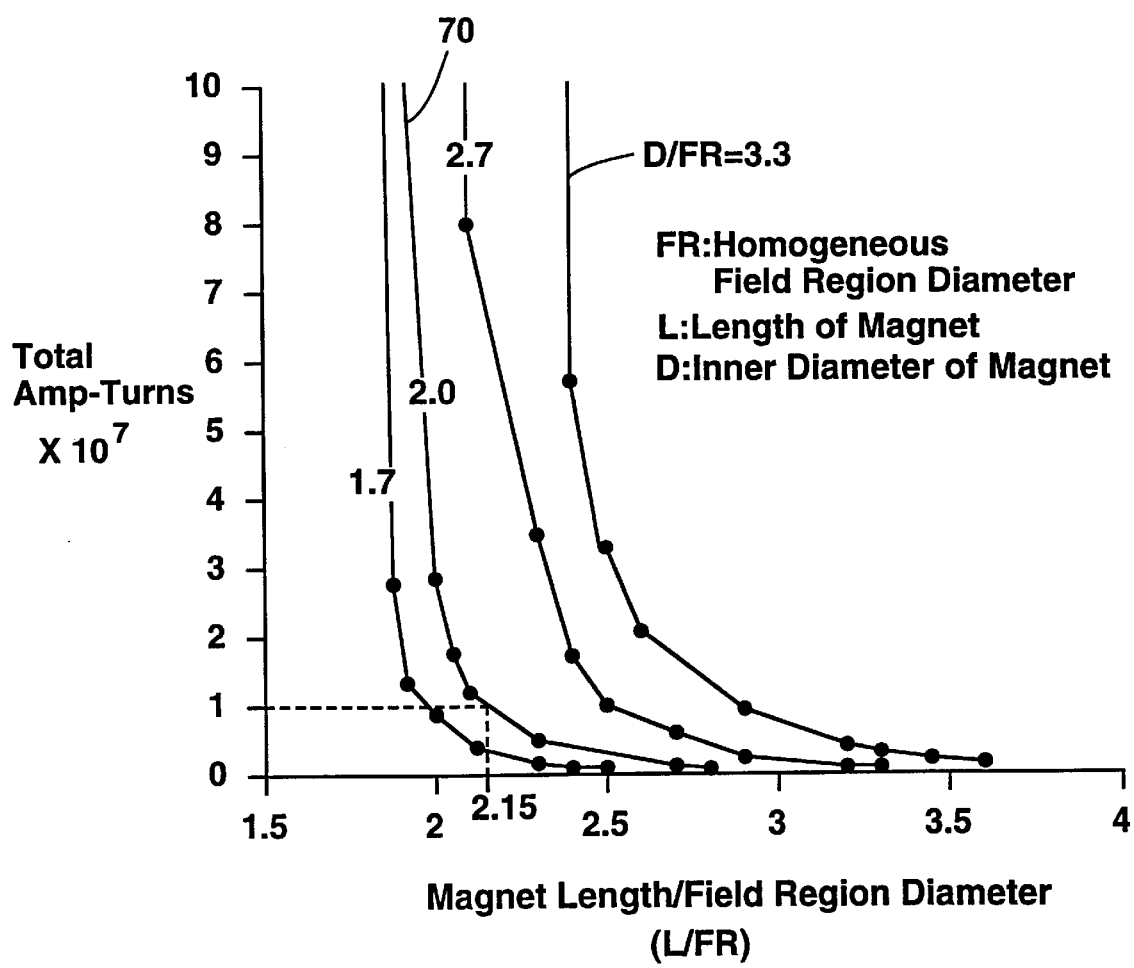
FIG. 13 is a graph illustrating the relationship between power consumption and magnet geometry for a family of optimized cylindrical magnets.

FIG. 13 shows a graph illustrating the relationship between power consumption and magnet geometry for a family of optimized cylindrical magnets which produce a homogenous field inside a field region. The graph was made using the method of the present invention to design many different magnets having coils of the same diameter. The power consumption is expressed in terms of the total number of Ampere-turns in the magnet. D is the coil inner diameter. L is the Z-length of the magnet. FR is the diameter of the field region, within which the magnetic field is homogeneous. FR is a measure of the size of the homogeneous field region. It can be seen from the graph that as the field region diameter increases relative to the length L or diameter D of an optimized cylindrical magnet, the required power for the magnet increases dramatically.

The graph of FIG. 13 can be used to estimate the best dimensions of a magnet. For example, if a 32 cm diameter homogeneous field region is desired, and a coil diameter of 64 cm is needed to fit a patient in the magnet, then D/FR= 64/32=2. Any magnet with these D/FR=2 will fall somewhere on curve 70. If 1×10⁷ Ampere-turns is selected as a factor for a maximum power consumption, then the magnet should have a L/FR ratio of about 2.15. In order to assure that the power consumption is less than the maximum power consumption, the magnet length L should be at least 2.15 (32)=68.8 cm. The values for L and D can then be used to define the predetermined coil region. The optimal coil arrangement can then be calculated using the method of the present invention.

It will be clear to one skilled in the art that the above embodiment may be altered in many ways without departing from the scope of the invention. For example, the present invention includes optimized magnet designs which are symmetric or asymmetric as well as optimized designs which are nonspherical or noncylindrical. Also, the present invention includes the possibility of specifying slightly different current densities for the different magnet coils. Accordingly, the scope of the invention should be determined by the following claims and their legal equivalents.

What is claimed is:

1. A method for producing an electromagnet such that the electromagnet is optimized for a predetermined axial magnetic field and predetermined coil region, said method comprising the steps of:

a) selecting a predetermined current density value J;

b) defining a plurality of target points and a desired axial magnetic field for each target point;

c) defining k virtual coils arranged coaxially in the predetermined coil region, where k is an integer greater than 1;

d) defining a power expression proportional to the total power dissipation of all the virtual coils, wherein the power expression is proportional to the expression:

$$P_1|i_1|+P_2|i_2|+P_3|i_3|+ \ldots +P_k|i_k|,$$

where P is the circumference of each virtual coil and i is the total current in each virtual coil;

e) defining an field homogeneity constraint for the maximum magnetic field deviation from the predetermined axial magnetic field for each target point;

f) establishing a calculation equivalent to a $L^1$-norm minimization calculation wherein the power expression is minimized subject to the constraint of the field homogeneity constraint;

g) solving the calculation of step (f) such that the current i for each virtual coil is determined;

h) constructing at least one magnet coil for carrying current at a location corresponding to the result of step (f), wherein the magnet coil carries current at the predetermined current density J.

2. The method of claim 1, wherein the steps (b) through (g) are repeated for nested regions within the predetermined coil region.

3. An electromagnet built according to the method of claim 1.

4. The method of claim 1, further comprising the step of determining a single value of current density for all magnet coils.

5. The method of claim 1, wherein the virtual coils are circular.

6. The method of claim 1, wherein the virtual coils are elliptical.

7. A method of producing an electromagnet such that the electromagnet is optimized for a desired axial magnetic field and predetermined coil region, said method comprising the steps of:

a) selecting a predetermined current density value J;

b) defining n target points and a desired axial magnetic field $b_n$ for each target point, where n is an integer greater than 1;

c) defining k virtual coils arranged coaxially in a predetermined region, wherein k is an integer greater than 1;

d) defining a n×k G-matrix which relates the current in each virtual coil to a magnetic field at each target point;

e) defining a power expression for the total power dissipation of the electromagnet, wherein the power expression is proportional to the expression:

$$r_1|i_1|+r_2|i_2|+r_3|i_3|+ \ldots +r_k|i_k|,$$

where r is the radius of each virtual coil and i is the total current in each virtual coil;

f) defining a k-dimensional vector I having elements $i_k$ wherein each element of I represents the current in each virtual coil;

g) defining a n-dimensional vector B having elements $b_n$, wherein each element of B represents the predetermined axial magnetic field at each target point;

h) defining a n-dimensional vector e having elements $e_n$, wherein each element of e represents the maximum deviation of the magnetic field at each target point;

i) establishing a calculation equivalent to a $L^1$-norm minimization calculation wherein the power expression is minimized subject to the condition that $|(G)(I)-(B)| \leq (e)$;

j) solving the calculation of step (h) such that the current i in each virtual coil is determined;

k) constructing at least one magnet coil for carrying current at a location corresponding to the result of step (i), wherein the magnet coil carries current at the predetermined current density J.

8. The method of claim 7, wherein the steps (b) through (f), (i) and (k) are repeated for nested regions within the predetermined coil region.

9. An electromagnet built according to the method of claim 7.

10. The method of claim 7, further comprising the step of determining a single value of current density for all magnet coils.

11. The method of claim 7, wherein the virtual coils are circular.

12. The method of claim 7, wherein the virtual coils are elliptical.

* * * * *

UNITED STATES PATENT AND TRADEMARK OFFICE
CERTIFICATE OF CORRECTION

PATENT NO.    : 6,255,929 B1
DATED         : July 3, 2001
INVENTOR(S)   : Xu, Hao et al.

It is certified that error appears in the above-identified patent and that said Letters Patent is hereby corrected as shown below:

Column 1,
Line 3, please insert the following: -- This invention was supported in part by grant numbers 2 DTA 901 and 2 DPM 568 from the TRDRP CA State Whitaker Foundation. The U.S. Government has certain rights in the invention. --

Signed and Sealed this

Twenty-first Day of January, 2003

JAMES E. ROGAN
*Director of the United States Patent and Trademark Office*